United States Patent [19]

Nakamura

[11] Patent Number: 5,530,273

[45] Date of Patent: Jun. 25, 1996

[54] SEMICONDUCTOR DEVICE CAPABLE OF PREVENTING REDUCTION OF CUT-OFF FREQUENCY BY KARK EFFECT EVEN WHEN OPERATED WITHIN A HIGH ELECTRIC CURRENT DENSITY RANGE

[75] Inventor: Satoshi Nakamura, Tokyo, Japan

[73] Assignee: NEC Corporation, Tokyo, Japan

[21] Appl. No.: 528,160

[22] Filed: Sep. 14, 1995

Related U.S. Application Data

[63] Continuation of Ser. No. 157,301, Nov. 26, 1993, abandoned.

[30] Foreign Application Priority Data

Nov. 26, 1992 [JP] Japan ................................. 4-317013

[51] Int. Cl.⁶ ................................................ H01L 31/0328
[52] U.S. Cl. ......................... 257/197; 257/655; 257/593
[58] Field of Search ................................ 257/593, 517, 257/518, 197, 198, 655

[56] References Cited

U.S. PATENT DOCUMENTS

4,958,208  9/1990  Tanaka ................................... 257/593

FOREIGN PATENT DOCUMENTS

| 60-160165 | 8/1985 | Japan | 257/593 |
| 62-33461 | 2/1987 | Japan | 257/197 |
| 63-14476 | 1/1988 | Japan | 257/593 |
| 3-105925 | 5/1991 | Japan | 257/197 |
| 3-138947 | 6/1991 | Japan | 257/197 |

OTHER PUBLICATIONS

Shinsuke Konaka et al., "A 20 ps/G Si Bipolar IC Using Advanced SST with Collector Ion Implantation", Extended Abstracts of the 19th Conf. on Solid State Devices and Materials, Tokyo, 1987, pp. 331–334.

E. F. Crabbé et al., "Low Temperature Operation of Si and SiGe Bipolar Transistors", International Electron Devices Meeting, 1990, pp. 17–20.

Jambotkar, "Fabrication of Integrated Circuits Incorporating High–Performance Bipolar Transistors," IBM Technical Disclosure Bulletin, vol. 19, No. 3, Aug. 1976, pp. 915–918.

*Primary Examiner*—Sara W. Crane
*Assistant Examiner*—Courtney A. Bowers
*Attorney, Agent, or Firm*—Sughrue, Mion, Zinn, Macpeak & Seas

[57] ABSTRACT

In a semiconductor device which includes a semiconductor substrate, a collector region of a first conductivity type formed on the semiconductor substrate, a base region of a second conductivity type reverse to the first conductivity type, an emitter region of the first conductivity type formed within the base region, an intermediate semiconductor layer of the second conductivity type is formed within the collector region, an additional semiconductor layer of the first conductivity type is superposed on the intermediate semiconductor layer, and the base region is overlaid on the additional semiconductor layer.

11 Claims, 14 Drawing Sheets

5,530,273

SEMICONDUCTOR DEVICE CAPABLE OF PREVENTING REDUCTION OF CUT-OFF FREQUENCY BY KARK EFFECT EVEN WHEN OPERATED WITHIN A HIGH ELECTRIC CURRENT DENSITY RANGE

This is a continuation of application Ser. No. 08/157,301 filed Nov. 26, 1993, now abandoned.

BACKGROUND OF THE INVENTION

This invention relates to a semiconductor device, such as a vertical bi-polar transistor, which is incorporated in an LSI circuit or the like.

In the manner which will later be described more in detail, a conventional semiconductor device of the type described comprises a semiconductor substrate, a collector region of a first conductivity type formed on the semiconductor substrate, a base region of a second conductivity type reverse to the first conductivity type overlaid on the collector region, and an emitter region of the first conductivity type formed within the base region.

Such a semiconductor device is operated within a high electric current density range for the purpose of high speed operation. However, as will later be also described more in detail, a reduction of cut-off frequency is inevitable caused to occur due to Kirk effect, when the semiconductor device is operated within a high electric current density range.

Several solutions to the problem have been proposed, one of which is to increase a space charge density in a depletion layer between a base and a collector, and another one of which is to raise a speed of electrons running in the depletion layer.

For instance, an example of the former is described in Extended Abstracts of the 19th Conference on Solid State Devices and Materials, 1987, Tokyo, pp. 331–334, while an example of the latter is described in International Electron Devices Meeting, 1990, pp. 17.

However, no suggestion is made in the above-mentioned references about reducing breakdown voltage between the base and the collector due to an increase of the space charge density and the like.

SUMMARY OF THE INVENTION

It is therefore an object of this invention to provide a semiconductor device which can prevent a reduction of cut-off frequency by Kirk effect, even when the semiconductor device is operated within a high electric current density range.

Other objects of this invention will become clear as the description proceeds.

According to an aspect of this invention, the semiconductor device comprises a semiconductor substrate, a collector region of a first conductivity type formed on the semiconductor substrate, an intermediate semiconductor layer of a second conductivity type reverse to the first conductivity type formed within the collector region, an additional semiconductor layer of the first conductivity type superposed on the intermediate semiconductor layer, a base region of the second conductivity type overlaid on the additional semiconductor layer, and an emitter region of the first conductivity type formed within the base region.

The collector region may have a first impurity concentration, the intermediate semiconductor layer may have a second impurity concentration, the base region may have a third impurity concentration, and the additional semiconductor layer may have a fourth impurity concentration, wherein the first impurity concentration may be greater than the second impurity concentration while the third impurity concentration may be greater than the fourth impurity concentration.

The collector region may be formed by a single crystal silicon layer while the base region may be formed by a mixed crystal layer consisting of Si and Ge.

DESCRIPTION OF THE PREFERRED EMBODIMENT

Referring to FIGS. 1 to 5, a conventional semiconductor device will first be described for a better understanding of this invention.

Figure 1:
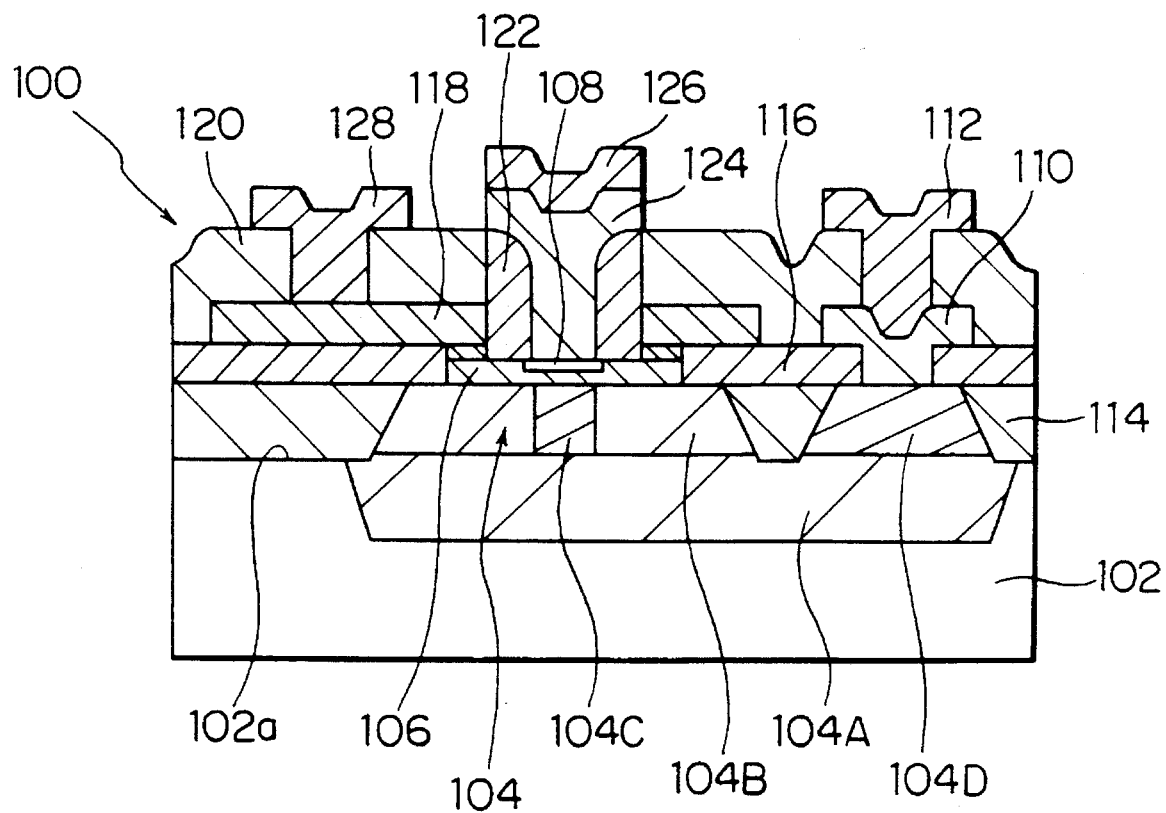
FIG. 1 is a schematic vertical sectional view of a conventional semiconductor device.

IN FIG. 1, illustration is made about an example of the conventional semiconductor device.

As illustrated in FIG. 1, the semiconductor device 100 comprises a silicon substrate 102, a collector region 104 of a first conductivity type N formed on the silicon substrate 102, a base region 106 of a second conductivity type P reverse to the first conductivity type N overlaid on the collector region 104, and an emitter region 108 of the first conductivity type N formed within the base region 106.

The silicon substrate 102 is of a conductivity type P⁻, which has a principal surface 102a directed upwards of FIG. 1. The collector region 104 includes a buried layer 104A of a conductivity type $N^{30}$ buried in the silicon substrate 102 to be flush with the principal surface 102a, an epitaxial layer 104B of a conductivity type N formed on the buried layer 104A, an N⁺ layer 104C formed within the epitaxial layer 104B, a collector drawing portion 104D of a conductivity type N⁺ formed on the buried layer 104A. The base region 106 is made to have a thickness of 50 nm, while the emitter region 108 is made to have a thickness of 38 nm.

The semiconductor device 100 further comprises a collector drawing electrode 110 connected to the collector drawing portion 104D, a collector electrode 112 connected to the collector drawing electrode 110, a field oxide layer 114 formed by a selective etching of the epitaxial layer 104B, a first interlayer insulating layer 116, a base drawing electrode 118 elongated on the interlayer insulating layer 116 and connected to the base region 106, a second interlayer insulating layer 120 overlaid on the base drawing electrode 118, a side wall layer 122 formed on an opened area of the second interlayer insulating layer 120, an emitter drawing electrode 124 connected to the emitter region 108, an emitter electrode 126 connected to the emitter drawing electrode 124, and a base electrode 128 connected to the base drawing electrode 118.

Figure 2:
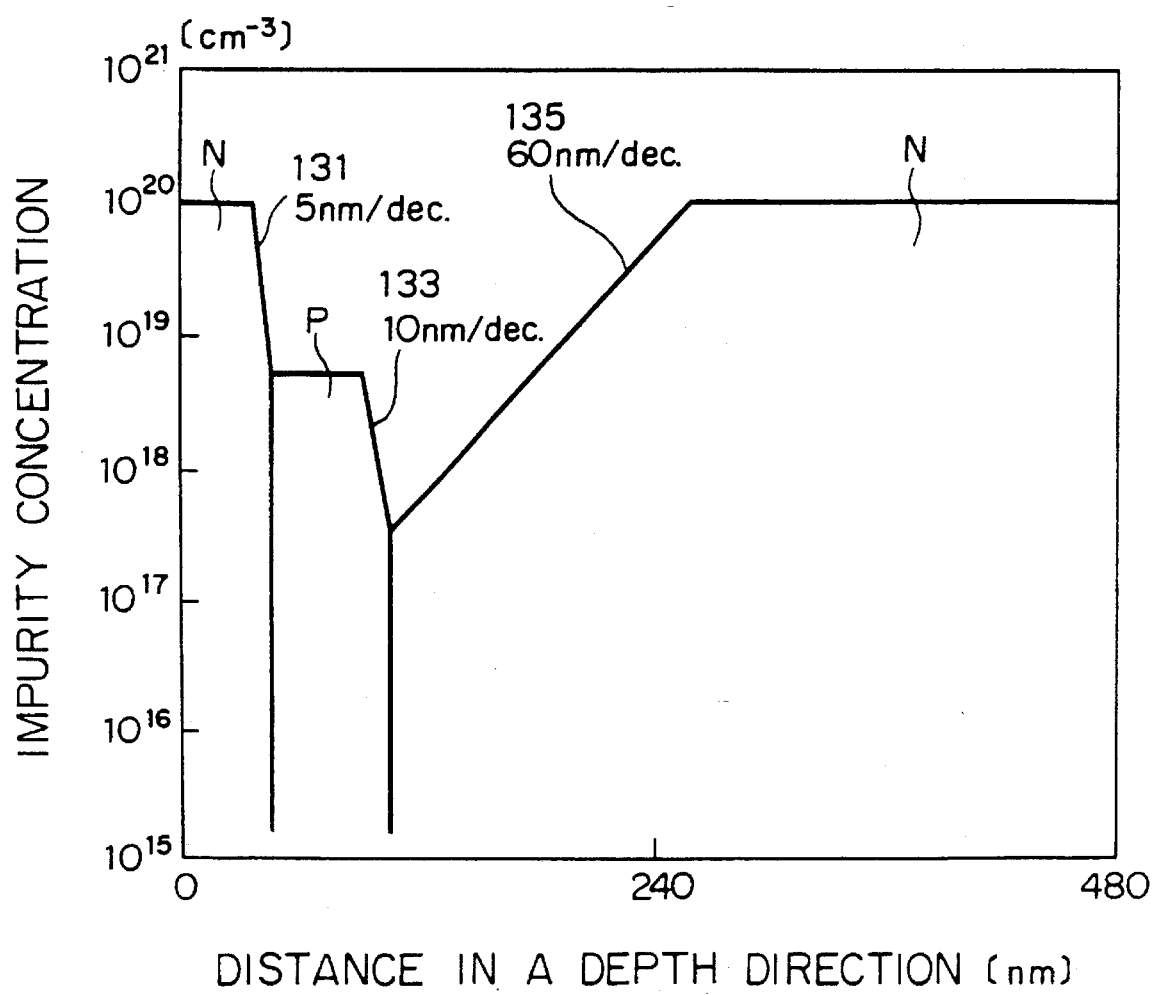
FIG. 2 is a graph for use in showing an impurity concentration profile of the semiconductor device illustrated in FIG. 1.

Referring to FIG. 2, description will proceed to an impurity concentration profile in the semiconductor device 100 illustrated in FIG. 1.

As illustrated in FIG. 2, the emitter region 108 of the conductivity type N has an impurity concentration of $1 \times 10^{20}$ cm⁻³ while the base region 106 of the conductivity type P has an impurity concentration of $5 \times 10^{18}$ cm⁻³. On the other hand, the collector region 104 of the conductivity type N comprises a shallow portion near to the base region 106 and a deep portion far from the base region 106. The shallow portion of the conductivity type N has an impurity concentration of $3 \times 10^{17}$ cm⁻³, while the deep portion of the conductivity type N⁺ has an impurity concentration of $1 \times 10^{20}$ cm⁻³.

In the interim, the impurity concentration profile illustrated in FIG. 2 has first through third inclined straight lines. The first inclined straight line 131 indicates a change of 5 nm/dec. (where the unit "nm/dec." is representative of a thickness of a layer, in which an impurity concentration is varied by a decimal digit) and the second inclined straight line 133 indicates a change of 10 nm/dec., while the third inclined straight line 135 indicates a variation of 60 nm/dec.

In order to estimate characteristics of the conventional semiconductor device 100 illustrated in FIG. 1, several experiments were carried out with respect to each distribution of an electric field and an electron temperature. An electron speed was also measured with respect to each distance in the depth directions.

Figure 3:
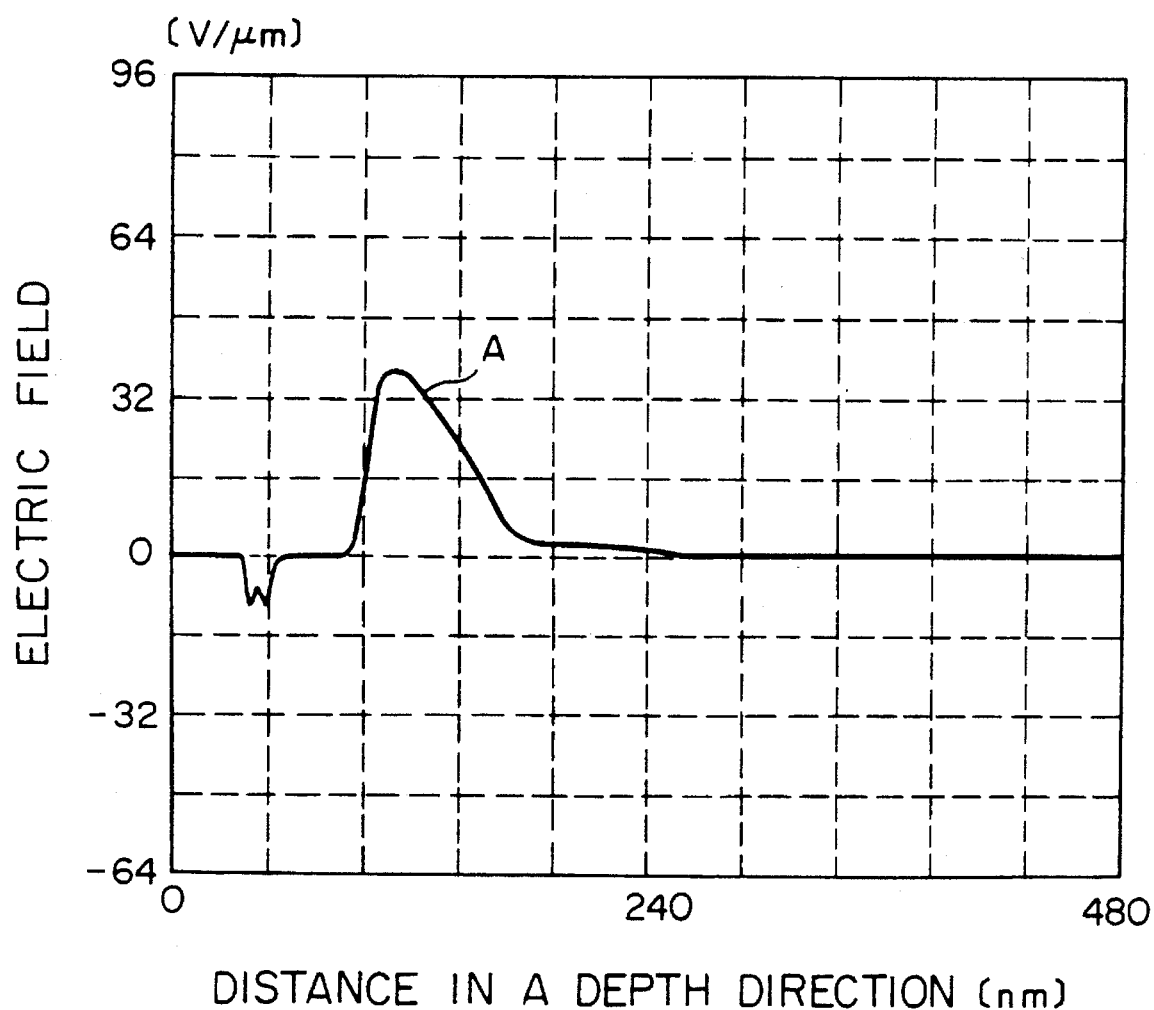
FIG. 3 is a graph for use in showing a distribution of electric field in the semiconductor device illustrated in FIG. 1.
Figure 4:
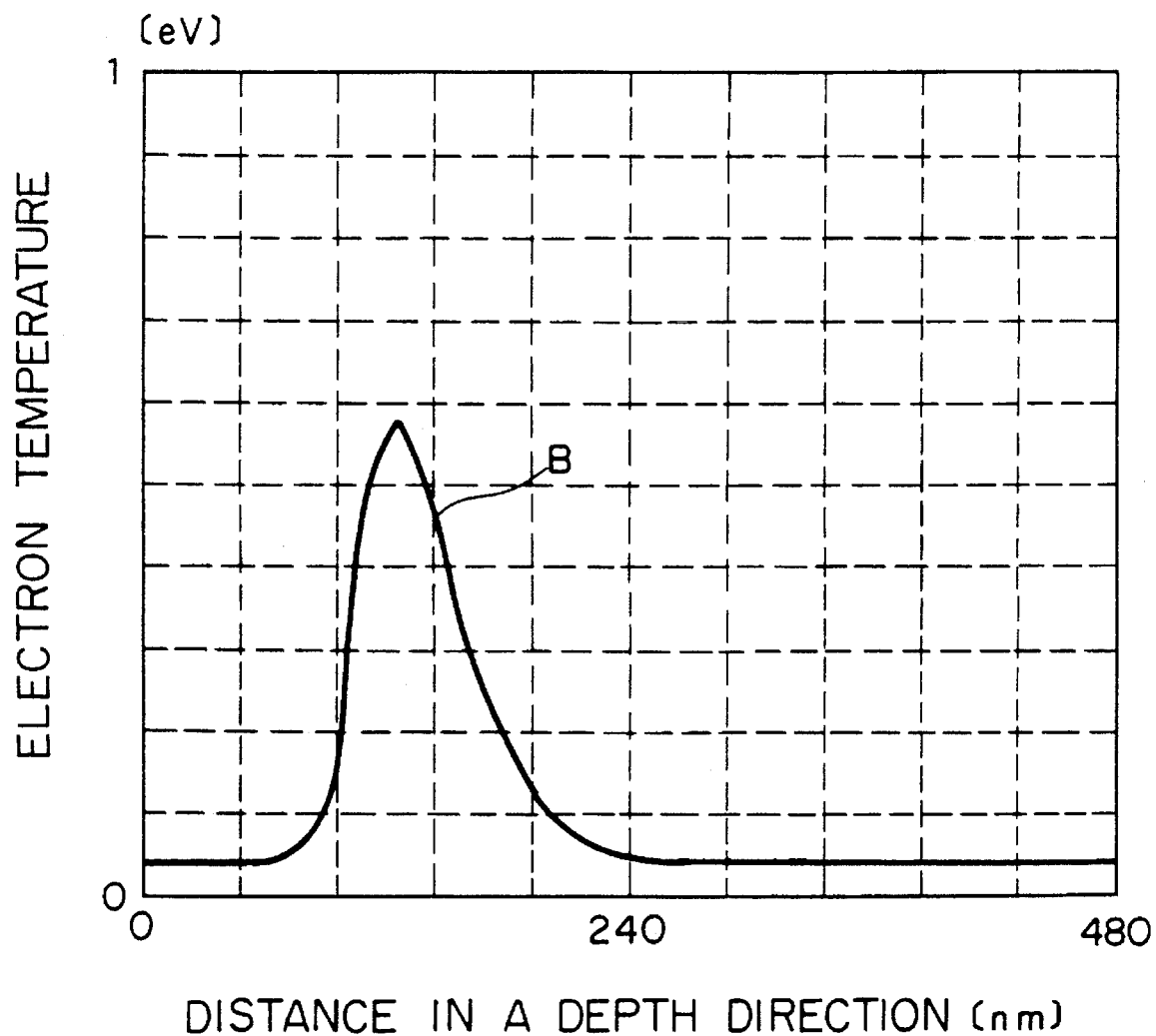
FIG. 4 is a graph for use in showing a distribution of electron temperature in the semiconductor device illustrated in FIG. 1.
Figure 5:
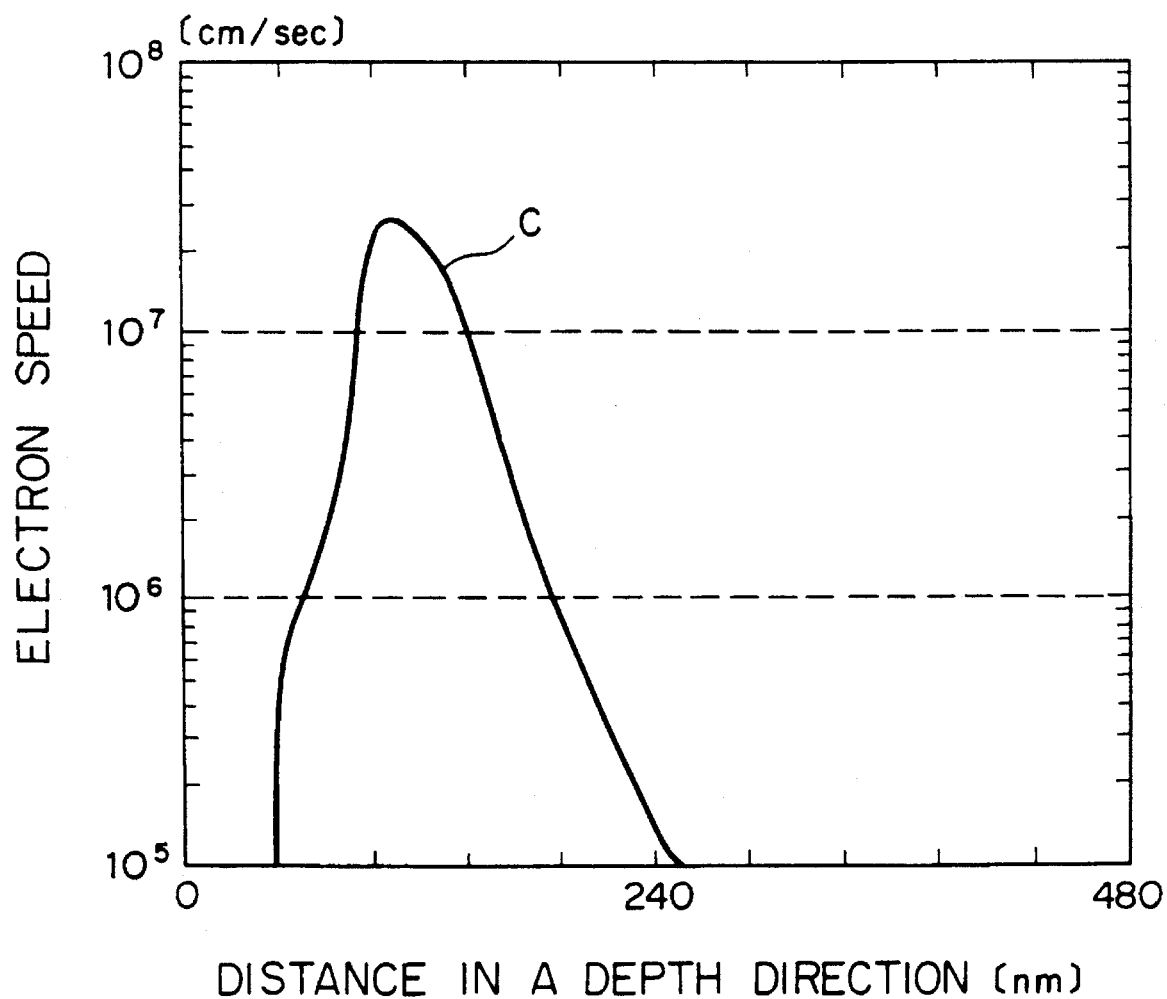
FIG. 5 is a graph for use in showing a distribution of electron speed in the semiconductor device illustrated in FIG. 1.

Referring now to FIGS. 3 to 5, characteristics of the experiments will be described in connection with the electric field, the electron temperature, and the electron speed.

In FIG. 3, a curve A shows a relationship between the electric field and a distance measured in the depth directions from a surface of the emitter region 108. As shown in FIG. 3, the curve A has a peak between 90 and 150 nm from the surface. The peak exceeds 32 V/μm.

In FIG. 4, a curve B also depicts a relationship between the electron temperature and a distance measured in the depth direction from the surface of the emitter region 108. The curve B also has an electron temperature peak between 90 and 200 nm from the surface.

In FIG. 5, a curve C also shows a relationship between the electron speed and a distance measured in the depth direction from the surface of the emitter region 108. The curve C ranges between 50 nm and 250 nm and exhibits the gentle speed peak around 100 nm.

In view of the characteristics of the conventional semiconductor device 100 identified by the above-mentioned experiments, it is considered that a reduction of cut-off frequency is inevitably caused to occur due to Kirk effect, when the semiconductor device 100 is operated within a high electric current density range. Herein, the high electric current density range means such a range that a collector current density is more than several mA/μm². As regards such a reduction of cut-off frequency due to Kirk effect, $f_T$-$J_C$ (cut-off frequency-collector current density) characteristics of a silicon bipolar transistor at room temperature are described in IEEE ELECTRON DEVICE LETTERS, VOL. 11, 4, pp. 171–173, April 1990. In this reference, the cut-off frequency of the silicon bipolar transistor is drastically reduced, when the silicon bipolar transistor is operated within the range that the collector current density exceeds several mA/μm².

Referring to FIGS. 6 to 11, description will proceed to a semiconductor device according to a first embodiment of this invention. Similar parts are designated by like reference numerals.

Figure 6A:
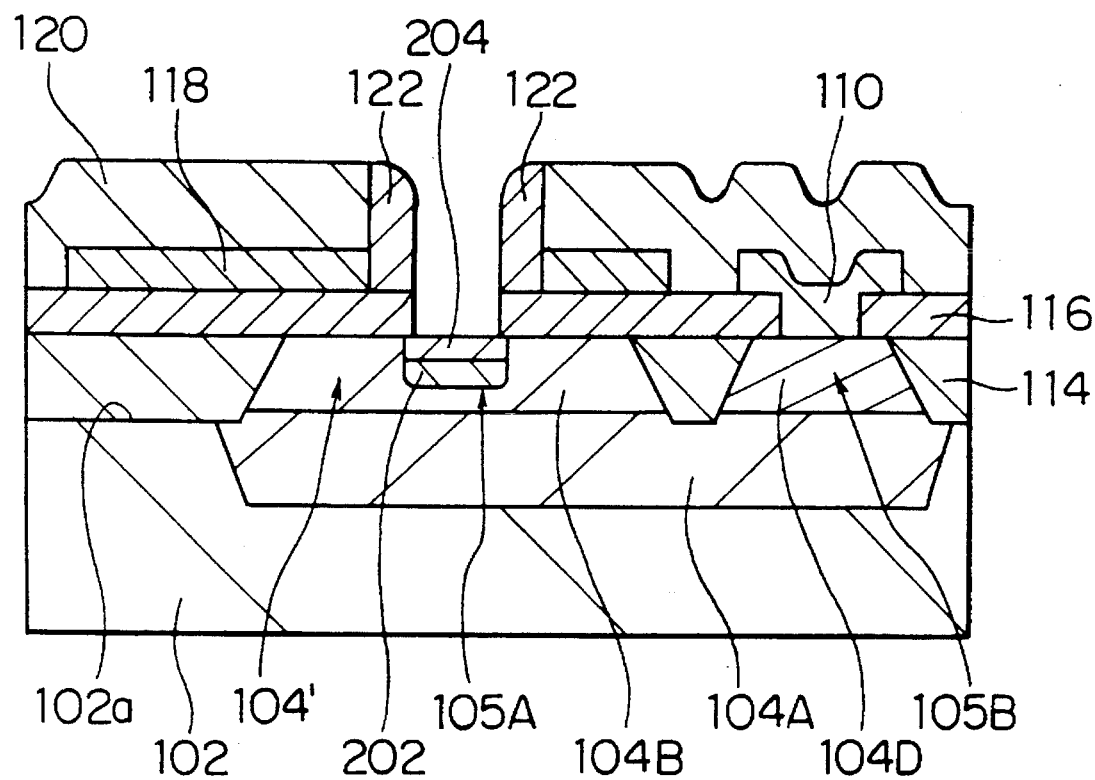
FIG. 6(A) to (E), drawn on three sheets, are schematic vertical sectional views of a semiconductor device according to a first embodiment of this invention at various steps of a method for manufacturing the semiconductor device.
Figure 6B:
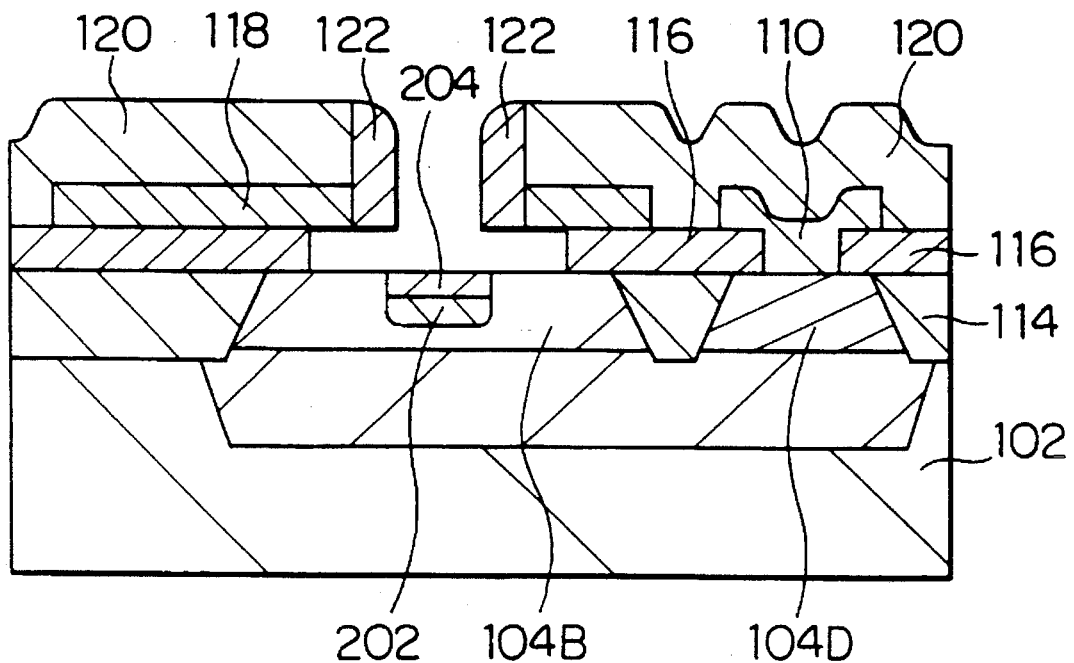
Figure 6C:
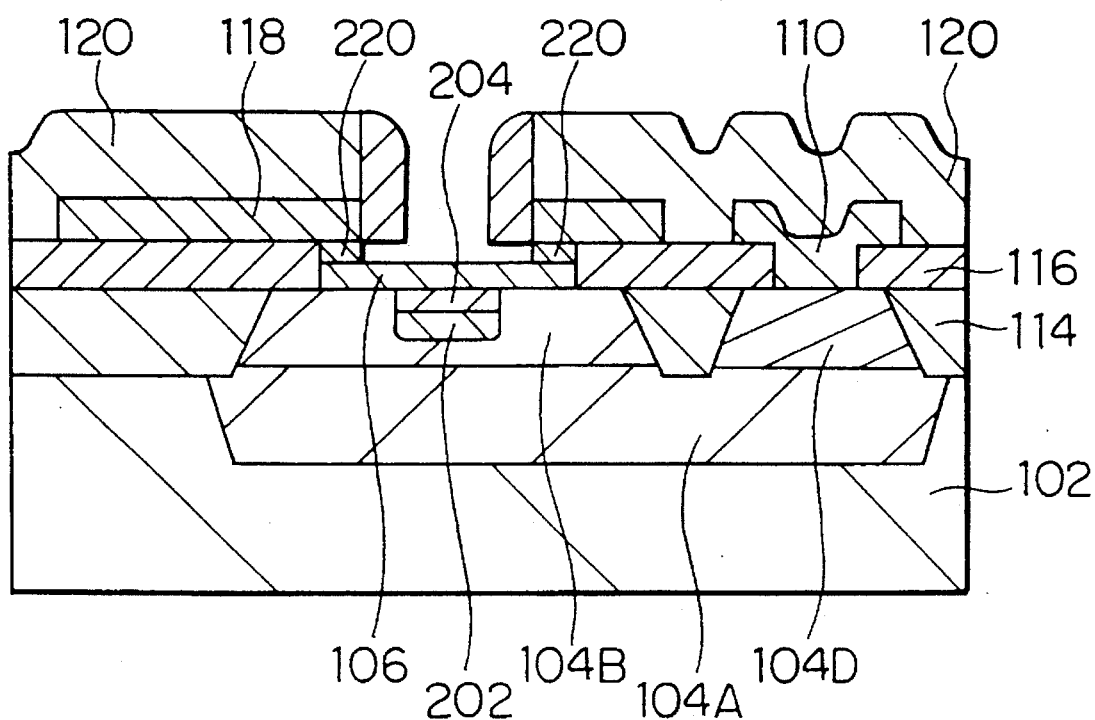
Figure 6D:
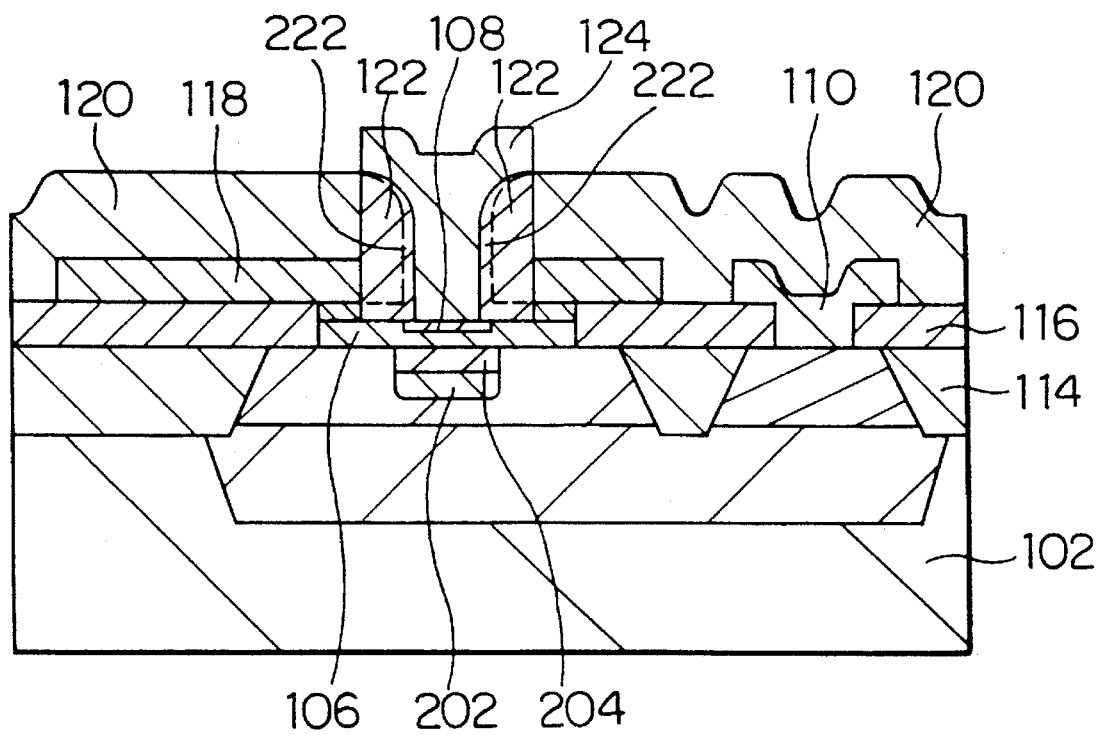
Figure 6E:
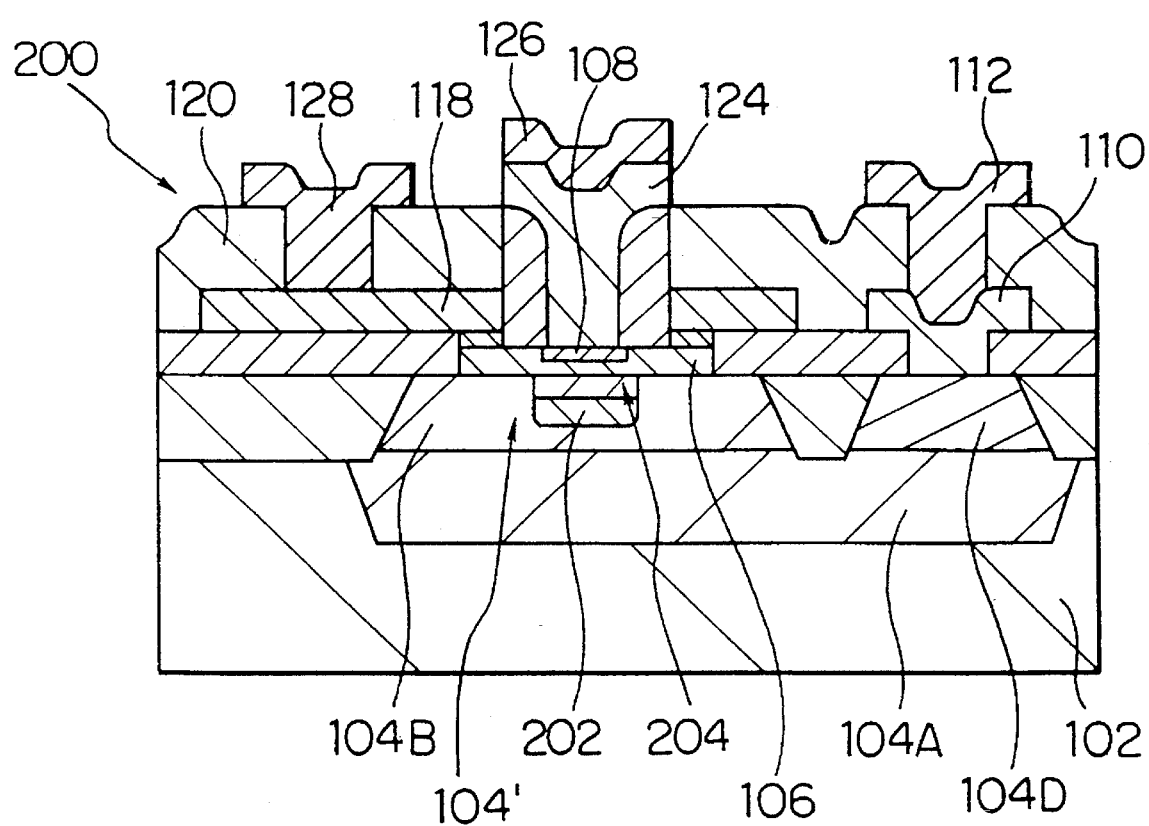

As illustrated in FIG. 6(E), the semiconductor device 200 comprises a semiconductor substrate 102, a collector region 104' of a first conductivity type N formed on the semiconductor substrate 102, an intermediate semiconductor layer 202 of a second conductivity type P reverse to the first conductivity type N formed within the collector region 104', an additional semiconductor layer 204 of the first conductivity type N superposed on the intermediate semiconductor layer 202, a base region 106 of the second conductivity type P overlaid on the additional semiconductor layer 204, and an emitter region 108 of the first conductivity type N formed within the base region 106.

Herein, referring to FIGS. 6(A) to (E), description is made about a method of manufacturing the semiconductor device 200.

In FIG. 6(A), the semiconductor substrate 102 is prepared in a known manner to have a principal surface 102a which is directed upwards of FIG. 6(A). The semiconductor substrate 102 is made of silicon and of a conductivity type P⁻, which has a resistivity of about 10 Ω/cm.

First, the buried layer 104A of the conductivity type N⁺ is formed to have an impurity concentration of $1 \times 10^{20}$ cm⁻³ by selectively doping arsenide (As) into the semiconductor substrate 102 through the principal surface 102a. An epitaxial lamina (not shown) of the conductivity type N is then deposited on the buried layer 104A as well as the principal surface 102a to have an impurity concentration of $2.4 \times 10^{18}$ cm⁻³ and a thickness of 150 nm.

Second, the epitaxial lamina is selectively oxidized to form not only the epitaxial layer 104B but also the field oxide layer 114 overlaid onto the principal surface 102a and the buried layer 104A. As a result, the field oxide layer 114 makes the collector region 104' isolated from the other ones (not shown) and separates a first element forming area 105A form a second element forming area 105B.

Third, the collector drawing portion 104D of the conductivity type N⁺ is formed by doping phosphorus (P) into the second element forming area 105B with the first element forming area 105A being masked.

Fourth, a first silicon nitride lamina is deposited on the first element forming area 105A, the second element forming area 105B, and the field oxide layer 114 to form the first interlayer insulating layer 116 by making a first opened area on the collector drawing portion 104D. Then, a polycrystalline silicon lamina is deposited on the first interlayer insulating layer 116 and the first opened area, and is patterned to form the collector drawing electrode 110 and the base drawing electrode 118.

Fifth, a second silicon nitride lamina is deposited on the base drawing electrode 118, the collector drawing electrode 110, and the first interlayer insulating layer 116 to form the second interlayer insulating layer 120 by making a second opened area on the first interlayer insulating layer 116 by selectively and anisotropically etching the second silicon nitride lamina and the base drawing electrode 118 one by one. A silicon oxide lamina is deposited on the second interlayer insulating layer 120 and the second opened area and is etched back entirely to form the side wall layer 122 on the side surface of the second opened area and to remove the first interlayer insulating layer 116 in the bottom of the second opened area.

Sixth, boron (B) is deeply doped into the epitaxial layer 104B by ion implantation to form the intermediate semiconductor layer 202 of the second conductivity type P. Further, phosphorus (P) is shallowly doped into the epitaxial layer 104B by ion implantation to form the additional semiconductor layer 204 of the first conductivity type N superposed on the intermediate semiconductor layer 202. In these events, the second interlayer insulating layer 120 and the side wall layer 122 are operable as doping masks.

Thereafter, as illustrated in FIG. 6(B), side surfaces of the first interlayer insulating layer 116 are side-etched in the second opened area by phosphoric acid to expose a part of a lower surface of the base drawing electrode 118 and a surface of the epitaxial layer 104B.

Next, as illustrated in FIG. 6(C), a single crystal silicon layer is deposited on the exposed surface of the epitaxial layer 104B and the additional semiconductor layer 204 by Ultra high vacuum chemical vapor deposition (UHV-CVD) method to form the base region 106. Further, a polycrystalline silicon layer 220 is deposited on the exposed lower surface of the base drawing electrode 118 by the UHV-CVD method to connect the base drawing electrode 118 with the base region 106.

Then, as illustrated in FIG. 6(D), a silicon oxide layer is deposited on the base region 106 by Low pressure chemical vapor deposition (LPCVVD) method to be filled with the second opened area and then etched-back to be left on side surfaces of the side wall layer 122 as a silicon oxide film 222, as shown by broken lines in FIG. 6(D), and to expose a surface of the base region 106. Further, a polycrystalline silicon lamina of a conductivity type N including arsenide (As) of impurity concentration of $1\times10^{20}$ cm$^{-3}$ is deposited on the second interlayer insulating layer 120 and the second opened area and is patterned to form the emitter drawing electrode 124. The emitter drawing electrode 124 is heat-treated by a known manner, such as a ramp annealing, to diffuse the above-mentioned As into the surface of the base region 106, so that the emitter region 108 is formed within the base region 106.

Finally, as illustrated in FIG. 6(E), the second interlayer insulating layer 120 is selectively etched-back on each of the base drawing electrode 118 and the collector drawing electrode 110 to make third and fourth opened areas thereon. An aluminum lamina is deposited on the second interlayer insulating layer 120, the emitter drawing electrode 124, and the third and the fourth opened areas and then patterned to form the base electrode 128, the collector electrode 112, and the emitter electrode 126.

Figure 7:
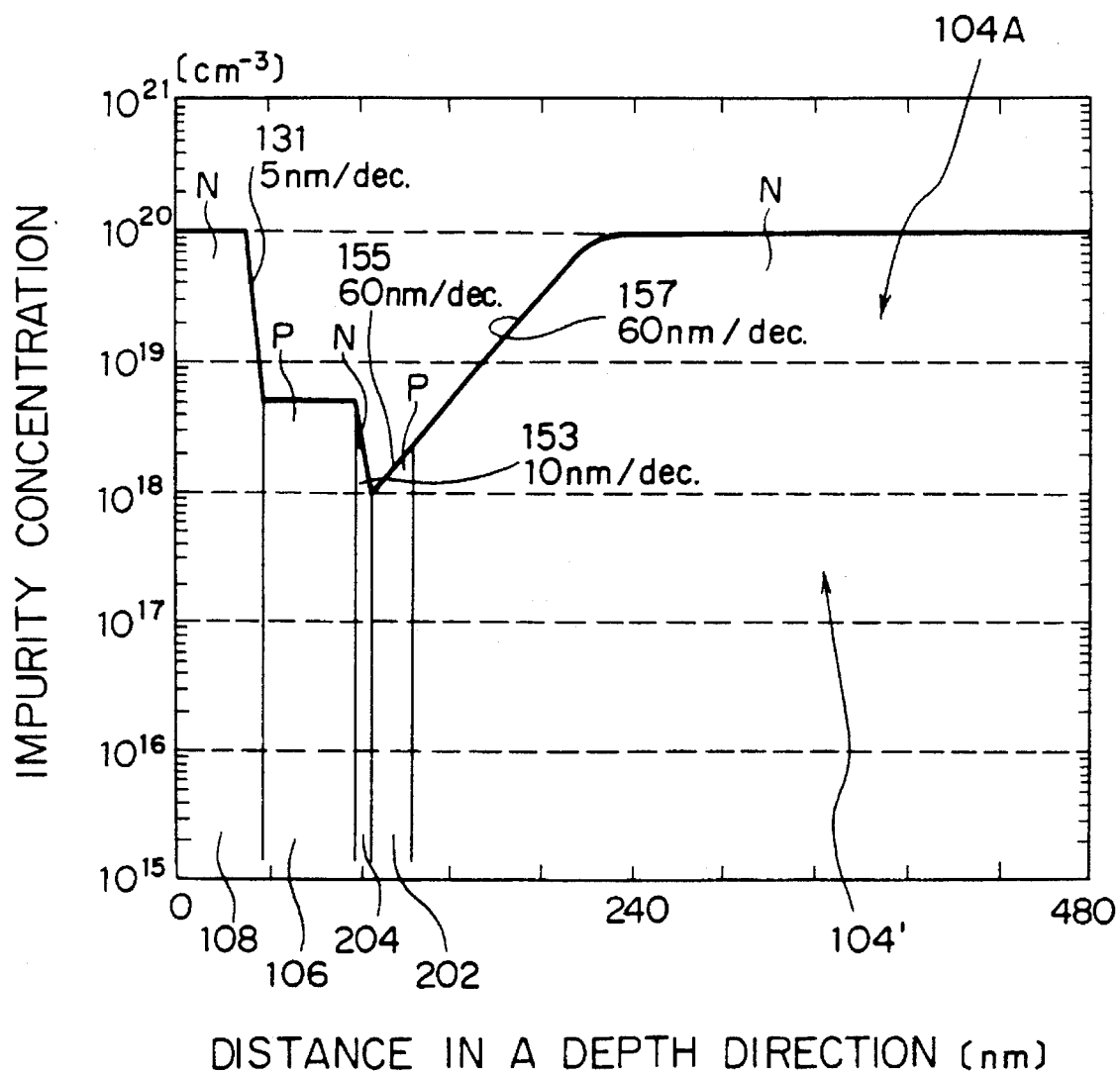
FIG. 7 is a graph for use in showing an impurity concentration profile of the semiconductor device illustrated in FIG. 6(E)

Referring to FIG. 7, description will proceed to an impurity concentration profile in the semiconductor device illustrated in FIG. 6(E).

As illustrated in FIG. 7, the emitter region 108 of the conductivity type N has an impurity concentration of $1\times10^{20}$ cm$^{-3}$ while the base region 106 of the conductivity type P has an impurity concentration of $5\times10^{18}$ cm$^{-3}$. On the other hand, the additional semiconductor layer 204 of the conductivity type N has an impurity concentration from $5\times10^{18}$ cm$^{-3}$ to $1\times10^{18}$ cm$^{-3}$ while the intermediate semiconductor layer 202 of the conductivity type P has an impurity concentration from $1\times10^{18}$ cm$^{-3}$ to $2.4\times10^{18}$ cm$^{-3}$. Moreover, the buried layer 104A of the conductivity type N$^+$ has an impurity concentration of $1\times10^{20}$ cm$^{-3}$.

In the interim, the impurity concentration profile illustrated in FIG. 7 has first through fourth inclined straight lines. The first inclined straight line 131 indicates a change of 5 nm/dec. and the second inclined straight line 153 indicates a change of 10 nm/dec. while the third and the fourth inclined straight lines 155 and 157 indicate a variation of 60 nm/dec.

In order to estimate characteristics of the semiconductor device 200 illustrated in FIG. 6(E), several experiments were carried out with respect to each distribution of an electric field and an electron temperature. An electron speed was also measured with respect to each distance in the depth directions. In these experiments, a forward bias voltage between the emitter and the base was kept at a voltage of 1.05 V. On the other hand, a reverse bias voltage was kept at a voltage of 1.0 V.

Figure 8:
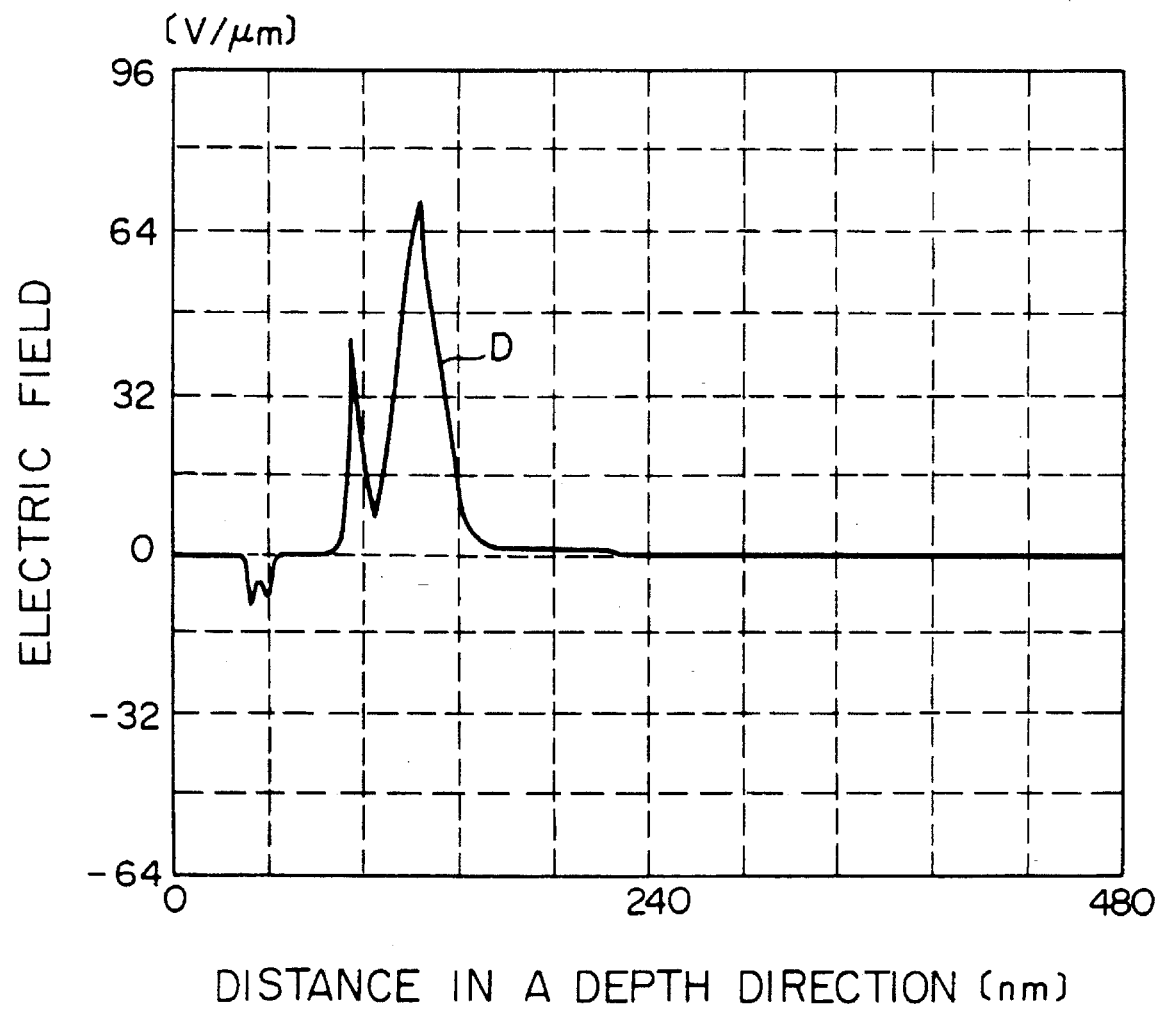
FIG. 8 is a graph for use in showing a distribution of electric field in the semiconductor device illustrated in FIG. 6(E)
Figure 9:
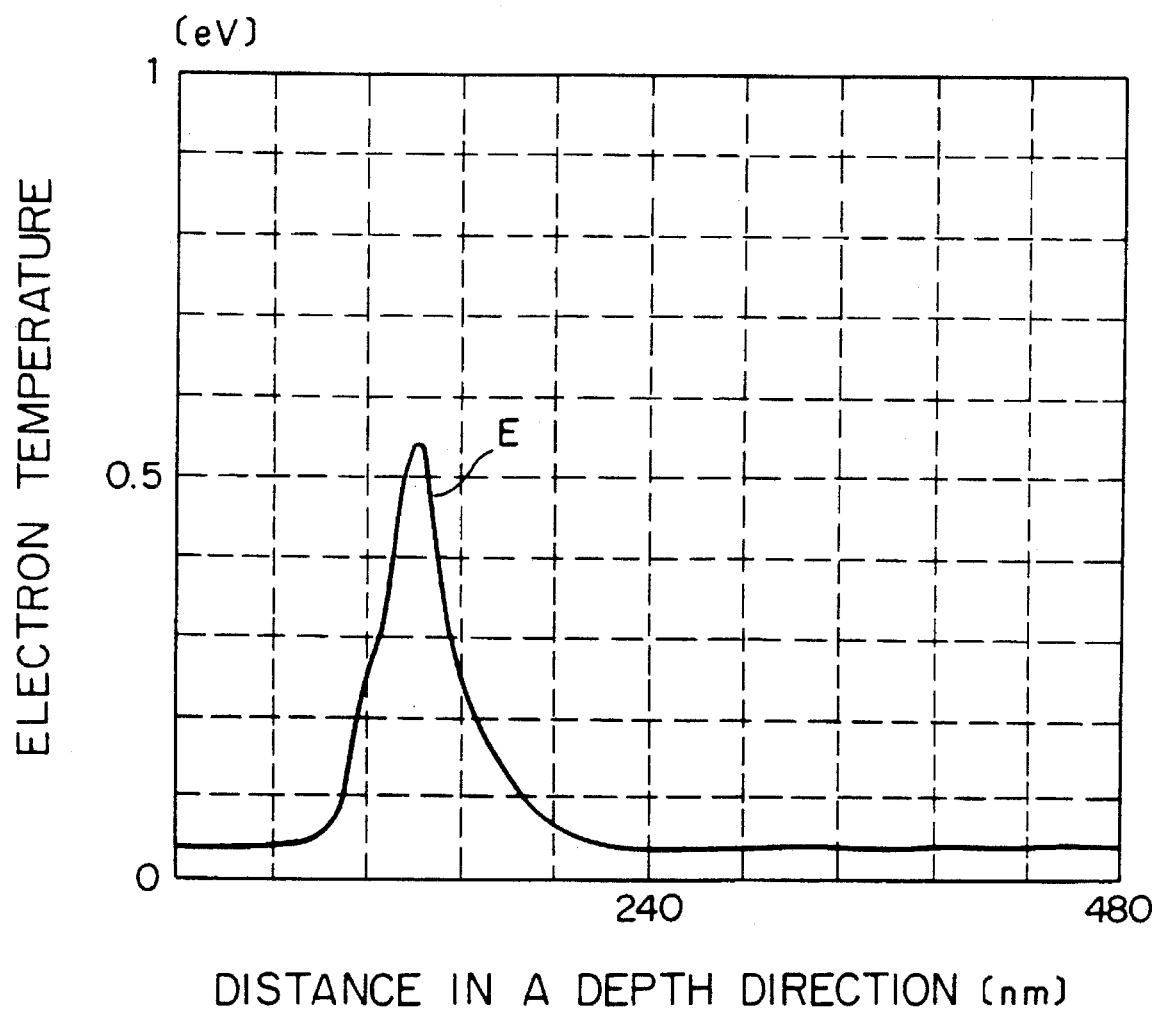
FIG. 9 is a graph for use in showing a distribution of electron temperature in the semiconductor device illustrated in FIG. 6(E)
Figure 10:
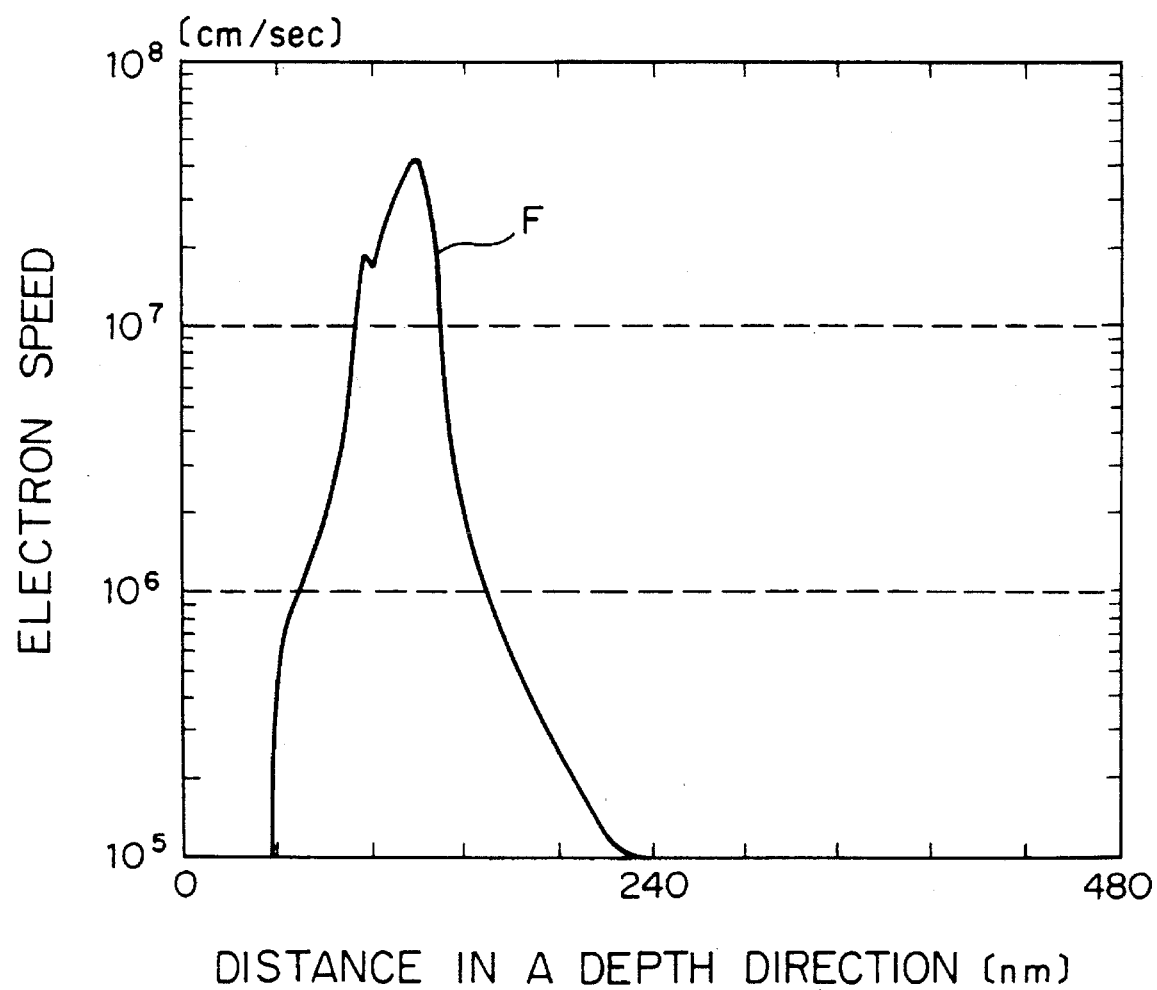
FIG. 10 is a graph for use in showing a distribution of electron speed in the semiconductor device illustrated in FIG. 6(E)

Referring now to FIGS. 8 to 10, characteristics of the experiments will be described in connection with the electric field, the electron temperature, and the electron speed.

In FIG. 8, a curve D shows a relationship between the electric field and a distance measured in the depth directions from a surface of the emitter region 108. As shown in FIG. 8, the curve D has two peaks between 90 and 150 nm from the surface. A higher one of the peaks exceeds 64 V/µm.

In FIG. 9, a curve E also depicts a relationship between the electron temperature and a distance measured in the depth direction from the surface of the emitter region 108. The curve E also has an electron temperature peak between 90 and 150 nm.

In FIG. 10, a curve F also shows a relationship between the electron speed and a distance measured in the depth direction form the surface of the emitter region 108. The curve F exhibits the highest speed peak between 90 and 150 nm. The highest speed peak exceeds $4\times10^7$ (cm/sec.

It is readily understood from FIGS. 7 and 8 that the curve D has a steep rise at an edge of the base region 106 and a steep down at an edge of the collector region 104', as specified by the peaks.

On the other hand, the curve E illustrated in FIG. 9 exhibits the electron temperature peak at the edge of the collector region 104'. This might occur due to the steep down of the electric field at the edge of the collector region 104', as mentioned with respect to FIG. 8.

Moreover, it was confirmed that the curve F exhibits the highest electron speed at a boundary between the base region 106 and the collector region 104', like in FIGS. 8 and 9. This might result from a steep inclination of electron temperature mentioned with respect to FIG. 9.

In order to estimate the distributions of the electric field, the electron temperature, and the electron speed obtained by the above-mentioned experiments, calculation was made about a transit-time of electrons which pass through an intrinsic base region, namely, the base region 106 and a depletion layer in the collector region on conditions that collector current densities are varied from one to another. Herein, the depletion layer was defined as a region in which electron speed becomes more than $5 \times 10^6$ cm/second. In addition, similar calculation was carried out as regards the conventional semiconductor device 100. In the conventional semiconductor device 100, a thickness of the depletion layer was made to be 50 nm as is similar to that of the semiconductor device 200.

Figure 11:
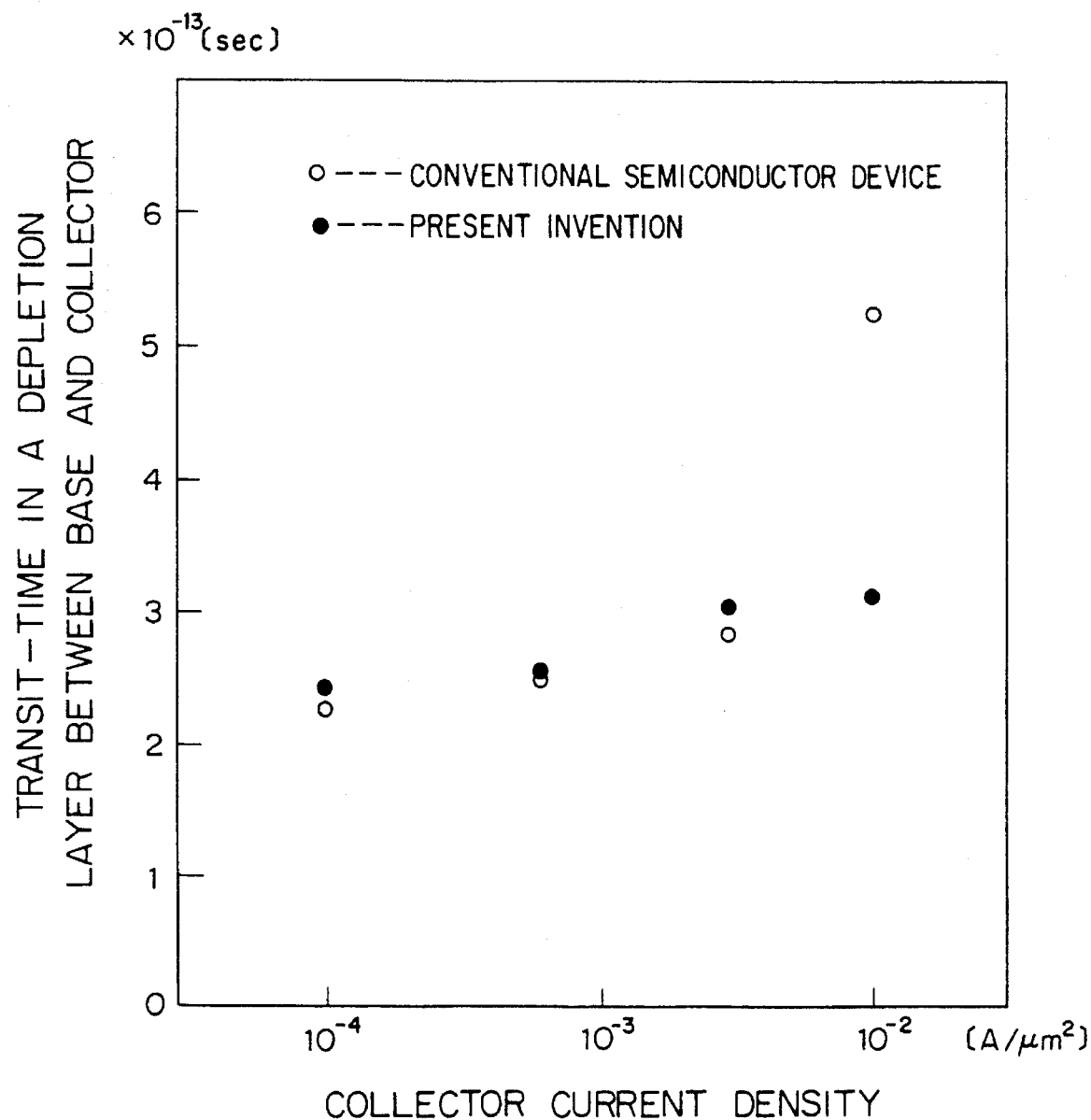
FIG. 11 is a graphical representation for use in describing a relationship between each collector current density and each electron transit-time in a depletion layer between a base and a collector in the conventional semiconductor device illustrated in FIG. 1 as well as the semiconductor device illustrated in FIG 6(E)

Referring to FIG. 11, within low and medium electric current density ranges, each transit-time of electrons in the semiconductor device 200 is approximately equal to that in the conventional semiconductor device 100. However, within high electric current density range, that is, $Jc=1 \times 10^{-2}$ A/$\mu$m$^2$, the transit-time in the semiconductor device 200 is approximately ⅗ of that in the conventional semiconductor device 100, as shown in FIG. 11.

Referring to FIG. 12, description will proceed to a semiconductor device according to a second embodiment of this invention.

The semiconductor device 300 according to the second embodiment has a structure similar to that of the above-described semiconductor device 200 except that each of the intermediate and the additional semiconductor layers is formed by an epitaxial layer. Similar parts are designated by like reference numerals.

Figure 12A:
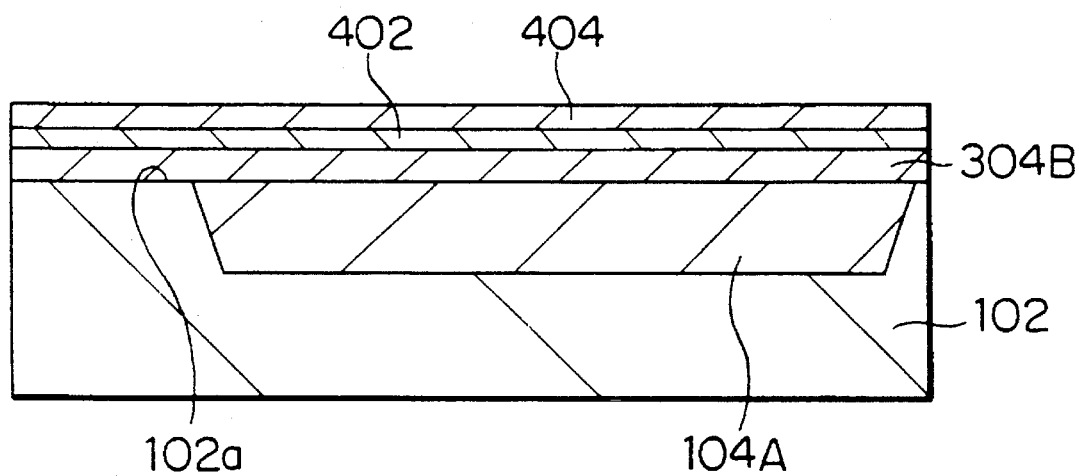
FIGS. 12(A) and (B) are schematic vertical sectional views of a semiconductor device according to a second embodiment of this invention at steps of a method for manufacturing the semiconductor device.
Figure 12B:
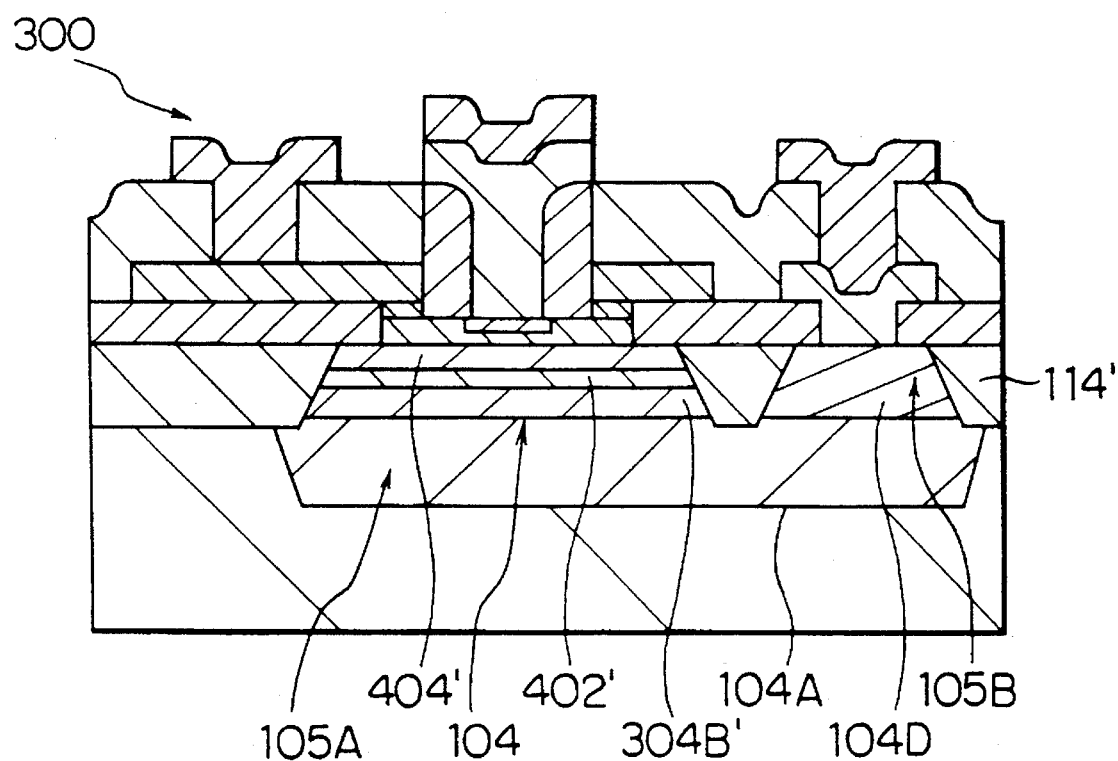

As illustrated in FIG. 12(B), the semiconductor device 300 has an intermediate semiconductor layer 402' of the second conductivity type P and an additional semiconductor layer 404' of the first conductivity type N superposed on the intermediate semiconductor layer 402'.

Herein, referring to FIGS. 12(A) and 12(B), description is made about a method of manufacturing the semiconductor device 300.

As illustrated in FIG. 12(A), after the buried layer 104A of the conductivity type N$^+$ is formed by the similar method mentioned as regards the first embodiment, a first epitaxial lamina 304B of the conductivity type N is, at first, deposited on the buried layer 104A as well as the principal surface 102a by the UHV-CVD method to have an impurity concentration of $2.4 \times 10^{18}$ cm$^{-3}$ and a thickness of 120 nm. The UHV-CVD method was carried out by the use of a reactive gas of Si$_2$H$_6$ on conditions that the pressure is held at $2 \times 10^{-5}$ Torr and that the temperature is kept at 560° C.

Next, a second epitaxial lamina 402 of the conductivity type P is deposited on the first epitaxial lamina 304B by the UHV-CVD method to have a thickness of 23 nm with an impurity concentration thereof changed from $2.4 \times 10^{18}$ cm$^{-3}$ to $1.0 \times 10^{18}$ cm$^{-3}$. A third epitaxial lamina 404 of the conductivity type N is then deposited on the second epitaxial lamina 402 by the same method to have a thickness of 7 nm with an impurity concentration thereof changed form $1.0 \times 10^{18}$ cm$^{-3}$ to $5.0 \times 10^{18}$ cm$^{-3}$.

As illustrated in FIG. 12(B), the first, the second and the third epitaxial laminae 304B, 402 and 404 are selectively oxidized to form not only the epitaxial layer 304B', the intermediate semiconductor layer 402' and the additional semiconductor layer 404' but also a field oxide layer 114' overlaid onto the principal surface 102a and the buried layer 104A. In this event, the field oxide layer 114' makes the collector region 104 isolated from the other ones (not shown) and separates the first element forming area 105A from the second element forming area 105B. The collector drawing portion 104D of the conductivity type N$^+$ is formed by doping phosphorus (P) into the second element forming area 105B, as mentioned before in respect of the first embodiment.

Thereafter, the base region, the emitter region and the other elements are formed in a manner similar to that of the first embodiment to provide the semiconductor device 300 illustrated in FIG. 12(B).

While this invention has thus far been described in conjunction with only two embodiments thereof, it will readily be possible for those skilled in the art to put this invention into practice in various other manners.

The base region 106 may be formed by a method other than the above-mentioned UHV-CVD method. For example, the base region 106 may be formed by an LPCVD method which is carried out on conditions that the pressure is held at several Torr. Furthermore, the UHV-CVD or the LPCVD method may be carried out by the use of reactive gas of Si$_2$H$_6$ and GeH$_4$ to provide the base region 106 which is formed by Si$_{1-x}$Ge$_x$ (X=30%) film. Thus, the base region may be formed by a mixed crystal layer consisting of Si and Ge, while the collector region is formed by a single crystal silicon layer.

What is claimed is:

1. A semiconductor device comprising:

a semiconductor substrate;

a collector region of a conductivity type N formed on said semiconductor substrate and having a first impurity concentration;

an intermediate semiconductor layer of a conductivity type P formed on said collector region and having a second impurity concentration;

an additional semiconductor layer of said conductivity type N superposed on said intermediate semiconductor layer and having a third impurity concentration;

a base region of said conductivity type P overlaid on said additional semiconductor layer and having a fourth impurity concentration; and an emitter region of said conductivity type N formed within said base region;

said first impurity concentration being greater than said second impurity concentration and said fourth impurity concentration being greater than said third impurity concentration;

each of said intermediate semiconductor layer and said additional semiconductor layer having a width larger than at least said emitter region;

said second impurity concentration varying in a first direction from said collector region to said additional semiconductor layer; and said third impurity concentration varying in a second direction from said intermediate semiconductor layer to said base region.

2. A semiconductor device as claimed in claim 1, wherein said collector region is formed by a single crystal silicon layer while said base region is formed by a mixed crystal layer consisting of Si and Ge.

3. A semiconductor device comprising:

a semiconductor substrate;

a collector region of a conductivity type N formed on said semiconductor substrate and having a first impurity concentration;

an intermediate semiconductor layer of a conductivity type P formed on said collector region and having a second impurity concentration;

an additional semiconductor layer of said conductivity type N superposed on said intermediate semiconductor layer and having a third impurity concentration;

a base region of said conductivity type P overlaid on said additional semiconductor layer and having a fourth impurity concentration; and an emitter region of said conductivity type N formed within said base region;

said first impurity concentration being greater than said second impurity concentration and said fourth impurity concentration being greater than said third impurity concentration;

said intermediate semiconductor layer and said additional semiconductor layer being wholly interposed between said collector region and said base region;

said second impurity concentration varying in a first direction from said collector region to said additional semiconductor layer; and said third impurity concentration varying in a second direction from said intermediate semiconductor layer to said base region.

4. The semiconductor device as claimed in claim 1, wherein:

said second impurity concentration decreases in said first direction; and said third impurity concentration increases in said second direction.

5. The semiconductor device as claimed in claim 4, wherein:

said second impurity concentration at a portion of said intermediate semiconductor layer which is adjacent to said collector region approximately equals said first impurity concentration at a portion of said collector region which is adjacent to said intermediate semiconductor layer; and said third impurity concentration at a portion of said additional semiconductor layer which is adjacent to said base region approximately equals said fourth impurity concentration at a portion of said base region which is adjacent to said additional semiconductor layer.

6. The semiconductor device as claimed in claim 5, wherein:

said second impurity concentration at a portion of said intermediate semiconductor layer which is adjacent to said additional semiconductor layer which is adjacent to said additional semiconductor layer approximately equals said third impurity concentration at a portion of said additional semiconductor layer which is adjacent to said intermediate semiconductor layer.

7. The semiconductor device as claimed in claim 4, wherein:

said second impurity concentration at a portion of said intermediate semiconductor layer which is adjacent to said additional semiconductor layer approximately equals said third impurity concentration at a portion of said additional semiconductor layer which is adjacent to said intermediate semiconductor layer.

8. The semiconductor device as claimed in claim 3, wherein:

said second impurity concentration decreases in said first direction; and said third impurity concentration increases in said second direction.

9. The semiconductor device as claimed in claim 8, wherein:

said second impurity concentration at a portion of said intermediate semiconductor layer which is adjacent to said collector region approximately equals said first impurity concentration at a portion of said collector region which is adjacent to said intermediate semiconductor layer; and said third impurity concentration at a portion of said additional semiconductor layer which is adjacent to said base region approximately equals said fourth impurity concentration at a portion of said base region which is adjacent to said additional semiconductor layer.

10. The semiconductor device as claimed in claim 9, wherein:

said second impurity concentration at a a portion of said intermediate semiconductor layer which is adjacent to said additional semiconductor layer approximately equals said third impurity concentration at a portion of said additional semiconductor layer which is adjacent to said intermediate semiconductor layer.

11. The semiconductor device as claimed in claim 8, wherein:

said second impurity concentration at a portion of said intermediate semiconductor layer which is adjacent to said additional semiconductor layer approximately equals said third impurity concentration at a portion of said additional semiconductor layer which is adjacent to intermediate semiconductor layer.

* * * * *